United States Patent
Kong et al.

(10) Patent No.: US 7,098,686 B2
(45) Date of Patent: Aug. 29, 2006

(54) SYSTEM GENERATED ELECTROMAGNETIC PULSE GUARD

(75) Inventors: Kam Wah Kong, West Covina, CA (US); David W. Gunning, Culver City, CA (US)

(73) Assignee: The Boeing Company, Chicago, IL (US)

( * ) Notice: Subject to any disclaimer, the term of this patent is extended or adjusted under 35 U.S.C. 154(b) by 57 days.

(21) Appl. No.: 10/847,183

(22) Filed: May 17, 2004

(65) Prior Publication Data

US 2005/0253623 A1   Nov. 17, 2005

(51) Int. Cl.
*G06F 7/38* (2006.01)
*H03K 19/173* (2006.01)
*H03K 19/0175* (2006.01)
*H03K 19/094* (2006.01)

(52) U.S. Cl. .............................. 326/38; 326/82; 326/83
(58) Field of Classification Search .................. 326/38, 326/82–83; 361/168.1
See application file for complete search history.

(56) References Cited

U.S. PATENT DOCUMENTS

| 4,148,015 | A | * | 4/1979 | Sekiya et al. ................. 345/49 |
| 4,807,081 | A | * | 2/1989 | Crofts et al. .................. 361/56 |
| 5,573,857 | A | * | 11/1996 | Auger ......................... 428/480 |
| 6,426,854 | B1 | * | 7/2002 | Allen ........................... 361/56 |

\* cited by examiner

*Primary Examiner*—Rexford Barnie
*Assistant Examiner*—Jason Crawford
(74) *Attorney, Agent, or Firm*—Armstrong Teasdale LLP

(57) ABSTRACT

A discharge guard circuit for use in combination with an integrated circuit that prevents the integrated circuit logic from damage or upset caused by system generated electromagnetic pulses at the integrated circuit outputs. The integrated circuit core logic is isolated from the output drivers and the discharge guard circuit, and the integrated circuit is configured to route system generated electromagnetic pulse current through the discharge guard circuit and out of the integrated circuit.

12 Claims, 4 Drawing Sheets

SYSTEM GENERATED ELECTROMAGNETIC PULSE GUARD

This invention was made with Government support. The government has certain rights in this invention.

FIELD OF INVENTION

This application relates in general to a method, apparatus, and article of manufacture that prevents overstress of an Application Specific Integrated Circuit (ASIC), and more particularly to a method, apparatus, and article of manufacture that routes System-Generated-Electromagnetic-Pulses (SGEMP) out of the ASIC immediately, thereby preserving ASIC core logic.

BACKGROUND

Satellites have a large number of wires and harnesses (cables) associated with them. These cables are generally composed of an inner silver-coated copper wire conductor, a central dielectric insulator layer, an outer silver-coated copper shield, and an external dielectric jacket. When these types of cables are exposed to transient X-rays and gamma-rays from a nuclear explosion, that is high-energy photons, large numbers of free electrons will be produced by the inner conductors and outer shield of the prior art cable. Many of these free electrons make their way to many electron traps in the dielectric at both the conductor-insulator interface and at the shield-insulator interface. Most of these latter, previously free, electrons will be stored, that is trapped, in electron traps of the cable insulators.

Trapped electrons occur as a result of excess free electrons transferring from the metal, namely conductors and shield, to the dielectric layer, that is insulator. The presence of gaps and spaces between the metal and the dielectric layer then prevent these excess electrons in the dielectric layer from returning to the metal to recombine with positive ions, namely holes, and hence they are trapped in the dielectric layer.

The spatial distribution of trap-sites and the differential number of trapped negative charges, at or near the shield-dielectric interface versus the negative charges at or near the conductor-dielectric interface, induce an electric field, namely an electromotive force, that acts on other electrons in the inner conductors and the outer shield. A pulse of electrical current called Systems-Generated-Electromagnetic Pulse ("SGEMP") will automatically flow through any conductive path from the inner conductors to the shield, or from the shield to the inner conductor, to balance the surge of displaced charges and to eliminate the electric field. When such a cable interconnects electronic equipment, a transient SGEMP current pulse is said to flow through the circuits that are the conductive pathways inside the electronic equipment between the shield and the conductors. An SGEMP current pulse, of either positive or negative polarity, can damage sensitive electronic components along its path.

X-rays and gamma-rays cause electrons to be displaced from the shield braid and from the conductors. Depending on the particular cable design, material geometry, gaps, radiation attenuation through materials, and the type of materials involved, more electrons are generally trapped at one interface than the other. This imperfect matching, of the forward-emitted shield wire electrons versus the reverse-emitted conductor core wire electrons, causes a charge imbalance. A resulting replacement current flows from the shield to the core wire, or from the core wire to the shield, through interconnected electronic circuits. Such transient negative or positive current, passing through electrical circuits, can cause upset or damage to sensitive electronic components inside the electronic box or equipment.

Classically, the problems associated with SGEMP current in cables are solved by the use of terminal protection, that is protection placed between the cable and the sensitive electronic circuits or equipment. This is done in order to clamp the voltage and shunt or limit the current to prevent damage to the sensitive interface circuits. Classic current shunting utilizes discreet voltage clamps, such as zener diodes or some other type of clamping diode, or filter capacitors that may be positioned inside or outside the electronic box or equipment. The SGEMP current can also be limited by adding series, current limiting resistance.

As technology has improved over time, speeds associated with data transmission and communications have increased. The use of classic terminal protection can adversely impact the signal integrity of high-speed digital signals. The excess loading caused by a discrete clamping diode or the mismatch caused by an added limiting resistor can degrade signal integrity. An alternative to the use of terminal protection that has been used in the past is to reduce cable SGEMP current by utilizing low SGEMP, radiation-hardened electrical cables such as that disclosed in U.S. Pat. No. 6,093,893. The electrical cable disclosed in U.S. Pat. No. 6,093,893 achieves radiation-hardness by the insertion of low-Z trapped-electron reducers. The trapped-electron reducers reduce the emission of electrons between the high-Z metallic conductor and insulator, and the emission of electrons between the high-Z metallic shield and insulator when the cable is irradiated by high energy photons. The trapped-electron reducers minimize gaps, which reduce the electron range to trap-sites and enhance charge recombination. In addition, radiation shielding can be used, reducing the X-rays and thus the SGEMP current.

The use of radiation hardened cables on a satellite can be quite costly and radiation shielding exceedingly heavy. There is a need for a device or circuit configuration that allows for the use of standard cables on satellites and other equipment having high-speed digital interfaces, whereby a shunt path is provided for the transient SGEMP current pulse without adversely effecting signal integrity.

SUMMARY OF THE INVENTION

The present invention relates to an integrated circuit including a discharge guard circuit that performs a method of preventing the integrated circuit logic from being damaged or upset upon the integrated circuit outputs receiving currents caused by system generated electromagnetic pulses. This method is performed by isolating the integrated circuit logic from other components of the integrated circuit, wherein the other components include an output driver and a discharge circuit. Isolation of the integrated circuit logic is preformed by providing the integrated circuit logic with a common ground and a first power supply that are separate from a discharge ground and a second power supply that are electrically connected to the output driver and the discharge circuit. The method further comprises connecting the output driver to the discharge guard circuit and routing currents caused by system generated electromagnetic pulses through the discharge circuit and out of the integrated circuit. The discharge guard circuit is comprised of a first metal routing portion, a second metal routing portion at least one first terminal protection device electrically connected to the first metal routing portion, at least one second terminal protection device electrically connected to the second metal routing portion. The first terminal protection device and the second terminal protection device are electrically connected to an output driver. In the preferred embodiment of the invention the first and second terminal protection devices are first and second diodes wherein the first diode is electrically connected to the first metal routing portion by electrically connecting the cathode of the first diode to the first metal routing portion and electrically connecting the anode of the first diode to the output driver. The second diode is electrically connected to the discharge guard device by electrically connecting the anode of the second diode to the second metal routing portion and electrically connecting the cathode of the second diode to the output driver.

DETAILED DESCRIPTION

Figure 1:
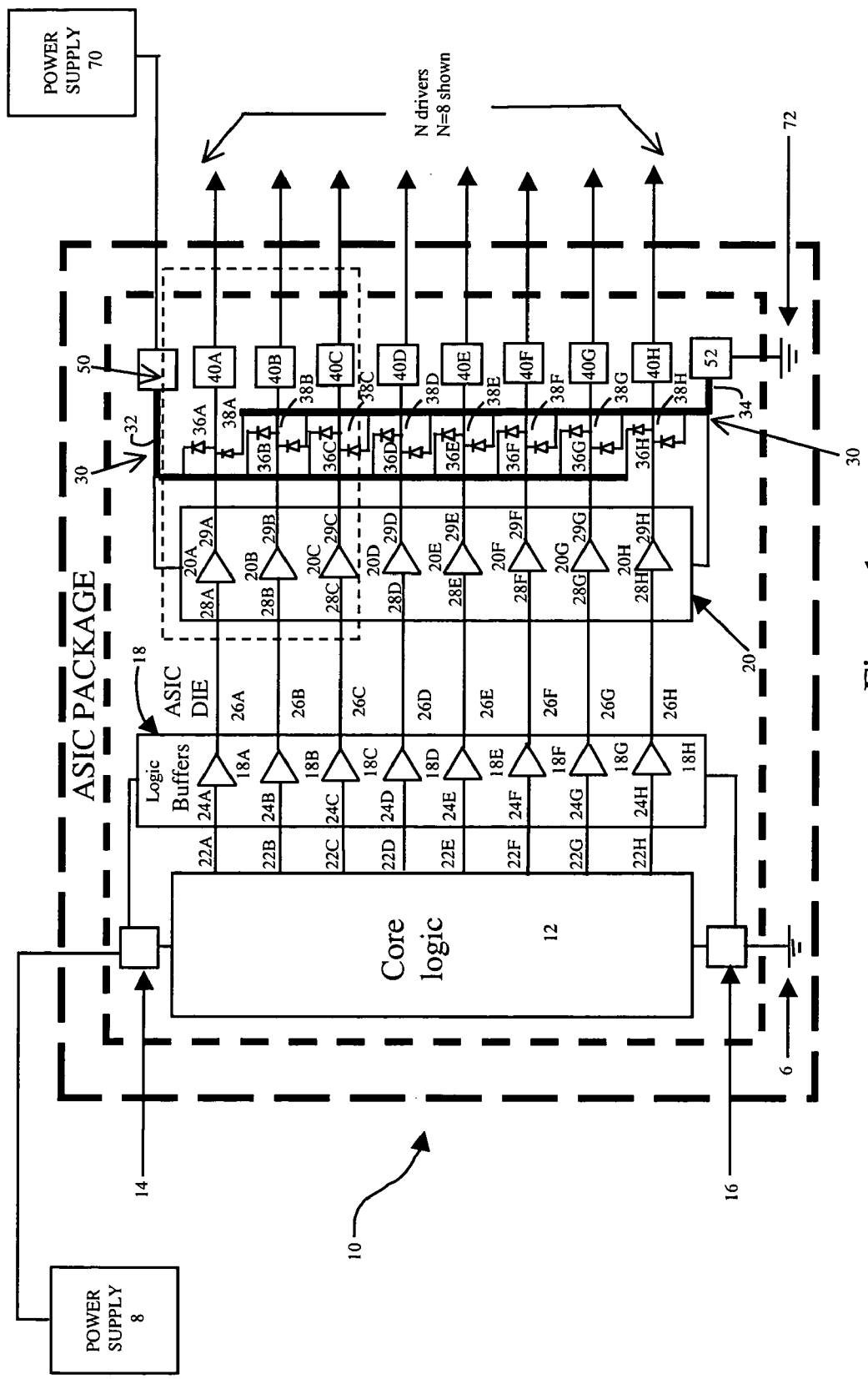
FIG. 1 illustrates an example embodiment of an integrated circuit including an SGEMP discharge guard device.

This application relates in general to a method, apparatus, and article of manufacture that performs as an SGEMP discharge guard device on a packaged ASIC die. In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

An SGEMP pulse can be as high as 0.5 Ampere per pin for 100 nanoseconds. For an ASIC with 100 cable drivers and more, more than 50 amperes can enter the ASIC in a duration of 100 nanoseconds. A specially designed periphery SGEMP discharge guard device is implemented inside the ASIC to route the SGEMP current entering the ASIC out of the ASIC immediately via another return pin. This SGEMP current discharge guard device return is isolated from the ASIC core logic power supply and ASIC core logic ground such that the ASIC internal core logic is not upset by the transient ground voltage excursions caused by SGEMP current flowing through the return path. The internal core logic of the ASIC is isolated from the output drivers with logic buffers and a separate power supply and ground. This configuration prevents the SGEMP current from upsetting the internal core logic of the ASIC.

The ASIC of the present invention that includes a discharge guard device also includes an internal core logic circuit, an arrangement of logic circuit buffers electrically connected to the internal core logic circuit, an arrangement of output drivers electrically connected to the arrangement of logic circuit buffers, and the discharge guard device that is electrically connected to the output drivers. The discharge guard device is comprised of a first metal routing portion, a second metal routing portion and a plurality of terminal protection devices. In the preferred embodiment, each terminal protection device is comprised of first and second clamping diodes. Each terminal protection device of the plurality of terminal protection devices is electrically connected to an output driver, the first metal routing portion and the second metal routing portion. In the present embodiment, the discharge guard device is configured as a discharge guard ring, wherein the first metal routing portion performs as a positive section of the discharge guard ring and the second metal routing portion performs as a negative section of the discharge guard ring. The first metal routing portion is electrically connected to a positive discharge bonding pad and the cathode of at least one of a plurality of first clamping diodes. The anode of each of the at least one of a plurality of first clamping diodes is electrically connected to an output of the output driver. The second metal routing portion is electrically connected to a negative discharge bonding pad, which also performs as SGEMP ground, and the anode of at least one of a plurality of second clamping diodes. The cathode of the at least one of the plurality of second clamping diodes is electrically connected to an output of the output driver.

As illustrated in FIG. 1, the ASIC 10 includes circuit core logic 12, a first positive power supply bond pad 14 to which a first positive power supply 8 is electrically connected, a core logic ground pad 16, to which common ground 6 is connected, an arrangement of core logic buffers 18, an arrangement of output drivers 20 (20A–20H), a discharge guard device 30, a plurality of output bond pads 40A–40H, a second power supply 70, and a second ground 72 that are electrically connected to the discharge guard device 30. As illustrated in FIG. 1, the arrangement of core logic buffers 18 are powered by the electrical connection to the first positive power supply 8, through bond pad 14. The arrangement of core logic buffers 18 is grounded via a connection to the core logic ground 6, through bond pad 16, so that the circuit core logic 12 and the arrangement of core logic buffers 18 have a common ground. The outputs 22A–22H of the core logic circuit 12 are electrically connected to the inputs 24A–24H of the arrangement of core logic buffers 18. The outputs 26A–26H of the arrangement of core logic buffers 18 are electrically connected to the inputs 28A–28H of the arrangement of output drivers 20. The outputs 29A–29H of the arrangement of output drivers 20 are electrically connected to the anodes of first clamping diodes 36A–36H and the cathodes of second clamping diodes 38A–38H. The cathodes of first clamping diodes 36A–36H are electrically connected to the positive portion of the SGEMP discharge guard device 32. The anodes of second clamping diodes 38A–38H are electrically connected to the negative portion of the SGEMP discharge guard device 34. The anodes of first clamping diodes 36A–36H and the cathodes of second clamping diodes 38A–38H are also electrically connected to a plurality of output bond pads 40A–40H for ASIC outputs 42A–42H (not shown).

The SGEMP guard device 30 is implemented on a packaged ASIC die and is configured in a ring. The SGEMP guard device 30 is generalized to the ASIC 10 by output bond pads 40A–40H, all of which are driven by output drivers 20. The internal circuit core logic 12 is isolated from the SGEMP discharge guard device with the core logic buffers 18 and the output drivers 20. The internal circuit core logic 12 and the core logic buffers 18 are biased by a first power supply 8 and ground 6 that are external to the packaged ASIC 10 through the first positive power supply bond pad 14 and the core logic ground bond pad 16. The first power supply 8 and core logic ground 6 are a separate power and ground from that utilized by output drivers 20. The SGEMP stressed output drivers 20 are biased by a second power supply 70 and ground 72 that are also external to the packaged ASIC 10 through a second power supply bond pad 50 and an SGEMP ground bond pad 52. The second power supply 70 and ground 72 are a power and ground separate from the first power supply 8 and core logic ground 6 utilized by the internal circuit core logic 12 and the core logic buffers 18.

The positive portion 32 of the SGEMP discharge guard device 30 is implemented by connecting the anodes of N first diodes 36A–36H to the outputs 29A–29H of each of N output drivers 20, and the cathodes of N first diodes 36A–36H to a first broad metallization routing 32 that is returned to a discharge bond pad 50. Likewise, the negative portion 34 of the SGEMP discharge guard device 30 is implemented by connecting the cathodes of N second diodes 38A–38H to the outputs 29A–29H of each of N output drivers 20, and the anodes of N second diodes 38A–38H to a second broad metallization routing 34 that is returned to a discharge bonding pad 52.

An SGEMP current pulse of 0.5 Ampere per output signal pin may occur simultaneously in a duration of 100 nanoseconds. First and second diodes 36A–36H and 38A–38H operate as voltage clamping diodes, routing the positive SGEMP pulse current out of the ASIC through power bonding pad 50 and routing the negative SGEMP pulse current through the ground bonding pad 52. For N output drivers that share a common second power supply bonding pad 50 and SGEMP ground bonding pad 52, it can be illustrated in FIG. 2 and 3 that if the width of the SGEMP discharge guard device's 30 first broad metallization routing portion 32 and the second broad metallization portion 34 are made broad enough to be on the order of N*L wherein L is the distance between the 0 centers of any two adjacent bonding pads, for example the distance between bonding pad 40 A and bonding pad 40 B, the voltage potential due to SGEMP at the output drivers 20 will be upper-bounded by the sum of the voltage potential at the second positive power supply bonding pad 50 and 0.5 volts, and lower bounded by the negative sum of the voltage potential at the SGEMP ground bonding pad 52 and 0.5 volts. This is especially true when N is less than eight or there are less than eight first clamping diodes 36 and less than eight second clamping diodes 38.

The turn-on voltage of the first and second clamping diodes 36A–36H and 38A–38H when a SGEMP current pulse hits the ASIC 10 is usually less than one volt for most ASIC process. Thus the voltage potential due to SGEMP at the output 29A–29H of output drivers 20 will be bounded by the sum of the voltage potential of −1.5 Volt and the voltage at SGEMP ground bonding pad 52 or that of +1.5 Volt and the voltage potential at second power supply bonding pad 50. The absolute maximum surge rating of an ASIC process is usually 1.5 to 2.5 Volts above its operating supply and below ground. Thus, the SGEMP discharge guard device can successfully route the SGEMP current pulses out of the ASIC through return bonding pads 50 and 52 without overstressing the ASIC 10. The surge voltage on the output 29A–29H of the output drivers 20 can be further reduced if broader return metallization is employed and more return paths are provided.

The size of each clamping diode utilized in the present invention is usually less than one-quarter in area of that of a bonding pad and thus the loading capacitance added on by the first and second clamping diodes to the outputs 29A–29H of the output drivers 20 is not significant compared to the parasitic capacitance of the bonding pad and package. The SGEMP discharge guard device 30 implementation does not impair the high-speed performance of the output driver, as would a discrete clamping diode outside an ASIC package.

Figure 2:
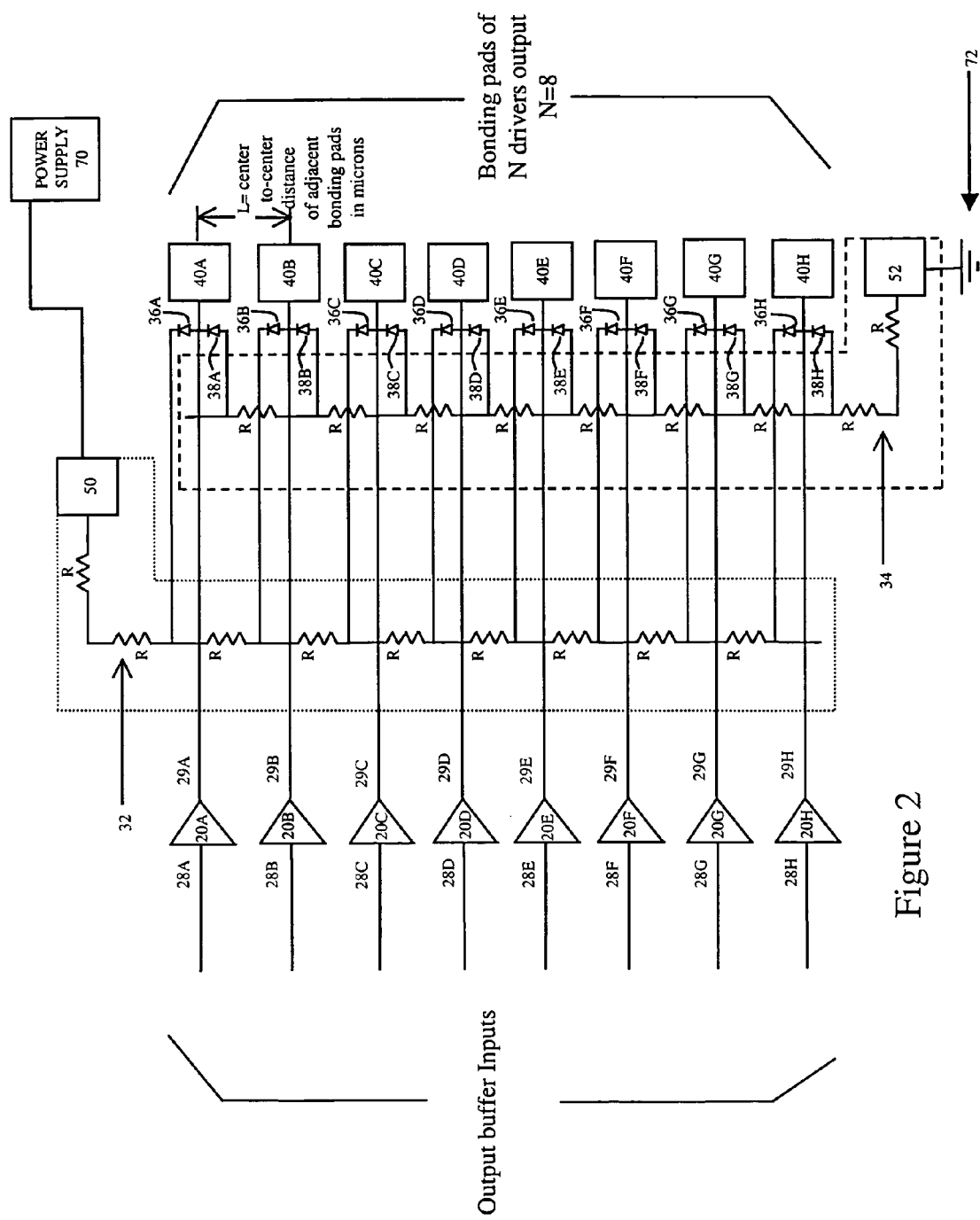
FIG. 2 illustrates an example embodiment of an SGEMP discharge guard device.
Figure 3:
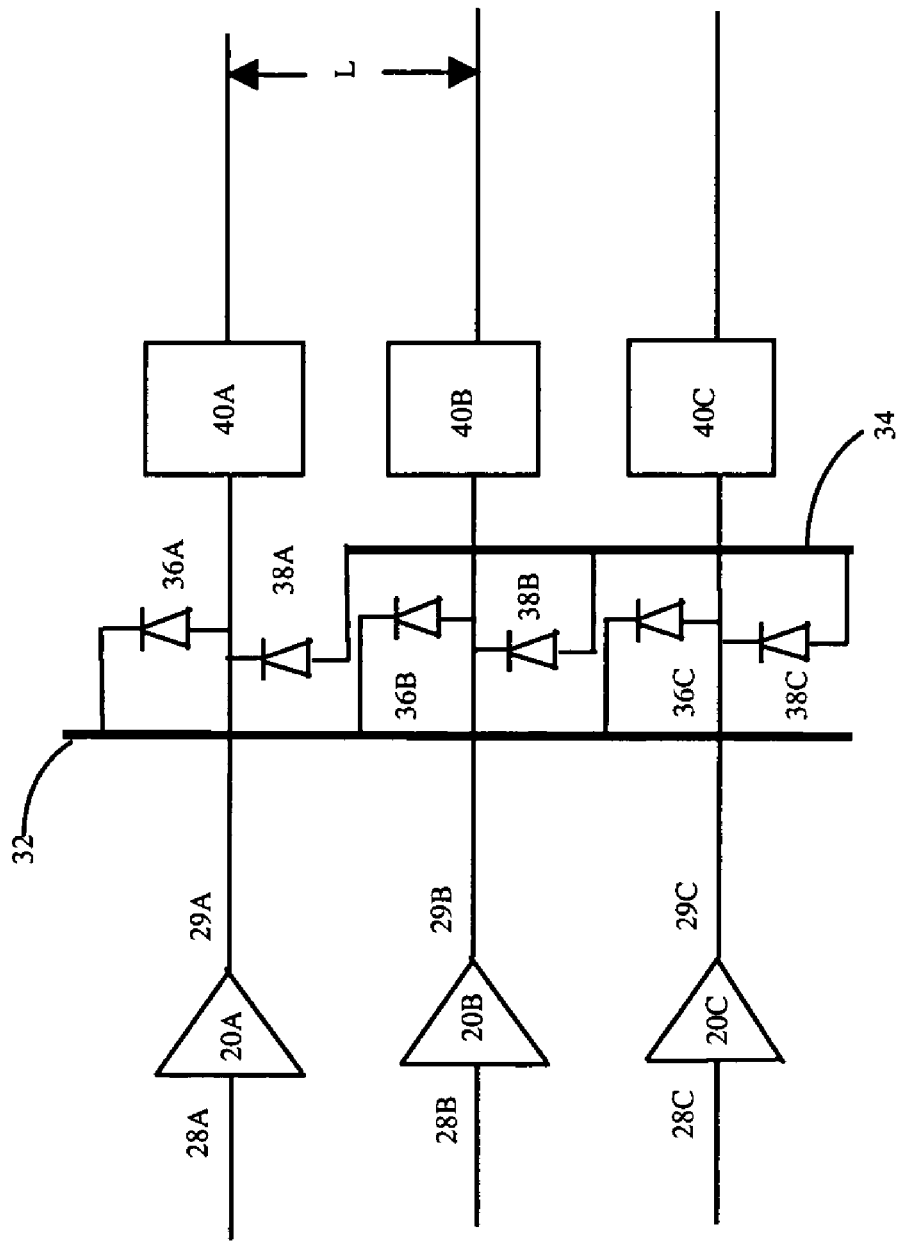
FIG. 3 illustrates a section of the embodiment of the SGEMP discharge guard device illustrated in FIG. 1.

FIG. 2 also illustrates a diagram for a calculation example of the surge voltage in an SGEMP discharge guard device. It consists of the schematic of a positive and a negative discharge ring portion in an ASIC 10 die for N output drivers 20 outputs 29A–29H into N bonding pads 40A–40H. The positive 32 and negative 34 discharge ring portions terminate at the second positive power supply bonding pad 50 and SGEMP ground bonding pad 52. The output driver bonding pads 40A–40H are shown as actual layout approximated by squares. R represents the series resistance for each square of the metal routing on the ring.

For the positive SGEMP discharge guard ring, considering the effect of 0.5 Ampere SGEMP current pulses acting alone on each output driver bond pad 40A–40H, table 1 illustrates voltage calculation:

TABLE 1

The surge voltage at bond pad 8 can be approximated as 0.5 Ampere * (1 + 8) * R = 4.5 * R Volt
The surge voltage at bond pad 7 can be approximated as 0.5 Ampere * (1 + 7) * R = 4.0 * R Volt
The surge voltage at bond pad 6 can be approximated as 0.5 Ampere * (1 + 6) * R = 3.5 * R Volt
The surge voltage at bond pad 5 can be approximated as 0.5 Ampere * (1 + 5) * R = 3.0 * R Volt
The surge voltage at bond pad 4 can be approximated as 0.5 Ampere * (1 + 4) * R = 2.5 * R Volt
The surge voltage at bond pad 3 can be approximated as 0.5 Ampere * (1 + 3) * R = 2.0 * R Volt
The surge voltage at bond pad 2 can be approximated as 0.5 Ampere * (1 + 2) * R = 1.5 * R Volt
The surge voltage at bond pad 1 can be approximated as 0.5 Ampere * (1 + 1) * R = 1.0 * R Volt By superposition, the surge voltage at Bond pad 40H=(4.5+4.0+3.5+3.0+2.5+2.0+1.5+1.0)*R Volt=22*R Volt. This is the maximum surge voltage seen by any of the N output drivers 20, since the output 29H of the output drivers 20 is farthest from the second positive power supply bonding pad 50. R can be approximated to be 15 milliohm per square. Thus the maximum positive surge on the positive portion of the guard ring 32 is 330 mV.

Likewise, the maximum surge voltage on the negative portion of the discharge guard ring 34 by the output 29A of the output driver 20, which is farthest from the SGEMP ground bonding pad 52 is also 330 mV assuming symmetry on layout.

Figure 4:
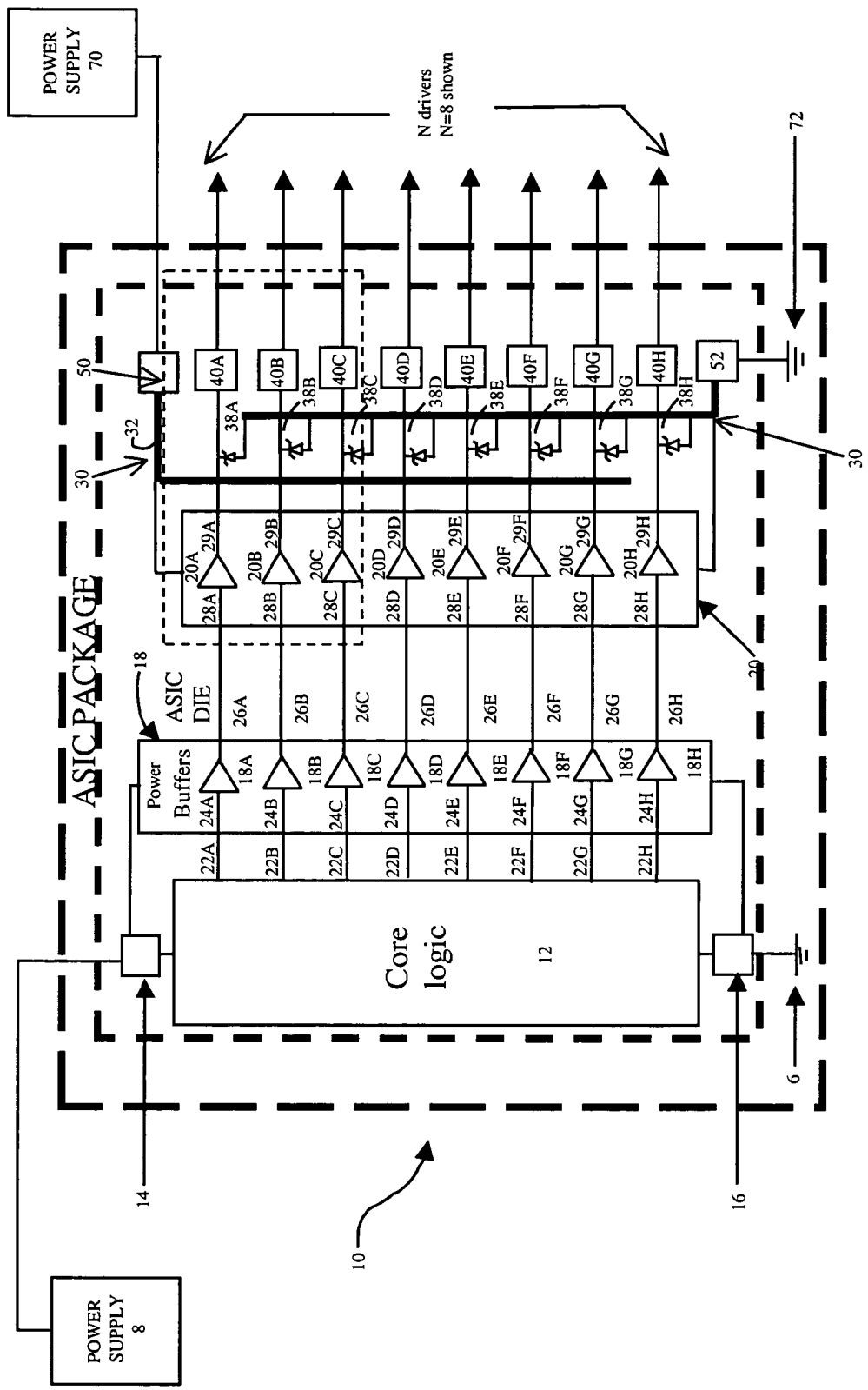
FIG. 4 illustrates an example embodiment of an integrated circuit including an SGEMP discharge guard device utilizing cold sparing.

The high reliability requirements of satellites force the use of redundancy in the ASIC design. For the ASIC illustrated in FIG. 1, an alternative embodiment would be to use a cold sparing configuration in which two ASICs would be utilized: a primary ASIC and a redundant ASIC. The primary ASIC is normally powered ON, and the redundant ASIC is normally powered OFF. A failure in the primary would result in action to turn OFF the failed primary ASIC and turn ON the redundant ASIC. One approach in utilizing redundancy in a design is cold sparing. In the cold sparing approach, the like outputs of the two ASICs, primary and redundant, are tied together. The SGEMP protection scheme described herein will not work for an ASIC design utilizing cold sparing. The outputs of the ASIC that is powered on will be tied to a zero potential supply voltage through the protection diode of the ASIC that is powered off. The ASIC that is powered on will not be able to output positive going signals as such signals would be clamped to zero potential. The solution to this problem involves two modifications to the SGEMP guard illustrated in FIG. 4. First, the positive protection first clamping diodes, 36A–36H, must be removed. This creates a vulnerability of the ASIC outputs to positive SGEMP current. To solve this problem, replace the negative protection diodes, 38A to 38H, with Zener diodes or equivalent clamping devices. The reverse breakdown voltage of the Zener diode or equivalent is chosen to be larger than the second power supply voltage 70. A positive polarity SGEMP pulse will break down the protection devices and the current will be shunted to SGEMP ground 72. The ASIC outputs must be able to withstand the magnitude of the breakdown voltage plus voltage drops of parasitic elements. A negative going SGEMP pulse will be shunted to SGEMP ground 72 through the forward biased protection devices.

As such, the foregoing description of the exemplary embodiments of the invention has been presented for the purposes of illustration and description. They are not intended to be exhaustive or to limit the invention to the precise forms disclosed. Many modifications and variations are possible in light of the above teaching. It is intended that the scope of the invention be limited not with this detailed description, but rather by the claims appended hereto. The present invention is presently embodied as a method, apparatus, and article of manufacture of an SGEMP discharge guard device on a packaged ASIC die.

What is claimed is:

1. An integrated circuit including a discharge guard device, comprising:
    a) internal circuit core logic;
    b) a plurality of buffers electrically connected to the internal circuit core logic;
    c) a plurality of output drivers electrically connected to the plurality of core logic buffers; and
    d) the discharge guard device electrically connected to the plurality of output drivers, the discharge guard device comprising:
        i) a first metal routing portion;
        ii) a second metal routing portion, wherein the width of the first metal routing portion and the width of the second metal routing portion are associated with a length between at least two bonding pads;
        iii) a plurality of terminal protection devices, wherein at least one of said plurality of terminal protection devices is electrically coupled to said first metal routing portion, said second metal routing portion and at least one of said plurality of output drivers.

2. The integrated circuit of claim 1 further including a first power supply and a common ground wherein the first power supply and the common ground are electrically connected to the internal core logic circuit and the plurality of core logic buffers, and the output drivers and the discharge guard device are powered by a second power supply and grounded using a second SGEMP ground.

3. The integrated circuit of claim 1 wherein the first metal routing portion and second metal routing portion are configured in a ring.

4. The integrated circuit of claim 1 wherein each of said plurality of terminal protective devices is comprised of a first diode and a second diode.

5. The integrated circuit of claim 4 wherein the first diode is electrically connected to the discharge guard device by electrically connecting the cathode of the first diode to the first metal routing portion and the anode of the first diode to the output buffer.

6. The integrated circuit of claim 4 wherein the second diode is electrically connected to the discharge guard device by electrically connecting the cathode of the second diode to the output buffer and the anode of the second diode to the second metal routing portion.

7. A System Generated Electromagnetic Pulse discharge guard circuit, comprising:
    a) a first metal routing portion for routing currents caused by System Generated Electromagnetic Pulses;
    b) a second metal routing portion for routing currents caused by System Generated Electromagnetic Pulses, wherein the width of the first metal routing portion and the width of the second metal routing portion are associated with a length between at least two bonding pads;
    c) at least one first terminal protective device electrically connected to the first metal routing portion;
    d) at least one second terminal protective device electrically connected to the second metal routing portion; and
    e) at least one output driver electrically connected to the first terminal protective device and the second terminal protective device.

8. The System Generated Electromagnetic Pulse discharge guard circuit of claim 7 wherein the at least one first terminal protective device is a first diode and the at least one second terminal protective device is a second diode.

9. The System Generated Electromagnetic Pulse discharge guard circuit of claim 8 wherein the first diode is electrically connected to the first metal routing portion by electrically connecting the cathode of the first diode to the first metal routing portion and the anode of the first diode to the output buffer.

10. The System Generated Electromagnetic Pulse discharge guard circuit of claim 8 wherein the second diode is electrically connected to the discharge guard device by electrically connecting the anode of the second diode to the second metal routing portion and the cathode of the second diode to the output buffer.

11. The System Generated Electromagnetic Pulse discharge guard circuit of claim 7 further including a guard circuit power supply and a guard circuit ground wherein the guard circuit power supply and the guard circuit ground are electrically connected to the System Generated Electromagnetic Pulse discharge guard circuit and isolated from the internal circuit core logic of an integrated circuit to which the System Generated Electromagnetic Pulse discharge guard circuit is electrically connected, wherein the internal circuit core logic has a separate internal circuit core logic power supply and a separate internal circuit core logic ground.

12. A method of preventing integrated circuit core logic of an integrated circuit from receiving currents caused by System Generated Electromagnetic Pulses by isolating the integrated circuit core logic from other components of the integrated circuit, wherein the other components include an output driver, and a discharge circuit, the method comprising:
    a) providing the integrated circuit core logic with a common ground and first power supply that are separate from a discharge ground and second power supply that are electrically connected to the output driver and the discharge circuit;

b) connecting the output driver to the discharge guard circuit, the discharge guard circuit comprising:
a first metal routing portion;
a second metal routing portion, wherein the width of the first metal routing portion and the width of the second metal routing portion are associated with a length between at least two bonding pads; and
a plurality of terminal protection devices, wherein at least one of the plurality of terminal protection devices is electrically coupled to the first metal routing portion, the second metal routing portion, and the output driver; and c) routing currents caused by System Generated Electromagnetic Pulses through the discharge circuit and out of the integrated circuit.

* * * * *